United States Patent
Copani et al.

(10) Patent No.: US 8,026,753 B2
(45) Date of Patent: *Sep. 27, 2011

(54) PRESCALING STAGE FOR HIGH FREQUENCY APPLICATIONS

(75) Inventors: Tino Copani, Riposto (IT); Santo Alessandro Smerzi, Catania (IT); Giovanni Girlando, Catania (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 2 days.

This patent is subject to a terminal disclaimer.

(21) Appl. No.: 12/607,655

(22) Filed: Oct. 28, 2009

(65) Prior Publication Data
US 2010/0109719 A1    May 6, 2010

Related U.S. Application Data

(63) Continuation of application No. 11/141,252, filed on May 31, 2005, now Pat. No. 7,663,414.

(30) Foreign Application Priority Data

May 31, 2004    (EP) .................................. 04425401

(51) Int. Cl.
*H03K 3/289* (2006.01)
(52) U.S. Cl. ......... 327/204; 327/115; 327/117; 327/203
(58) Field of Classification Search .................. 327/115, 327/116, 117, 118, 199, 355–360, 202, 203, 327/208–215, 218; 377/47, 48
See application file for complete search history.

(56) References Cited

U.S. PATENT DOCUMENTS

| | | | |
|---|---|---|---|
| 4,904,952 A | 2/1990 | Tanimoto | |
| 4,906,869 A | 3/1990 | Masuoka | |
| 4,977,335 A * | 12/1990 | Ogawa | 327/204 |
| 5,015,872 A | 5/1991 | Rein | |
| 5,489,878 A | 2/1996 | Gilbert | |
| 5,510,734 A * | 4/1996 | Sone | 327/65 |
| 5,892,382 A * | 4/1999 | Ueda et al. | 327/202 |
| 5,917,377 A | 6/1999 | Asazawa | |
| 5,920,235 A | 7/1999 | Beards et al. | |
| 5,961,215 A * | 10/1999 | Lee et al. | 374/178 |
| 6,163,181 A | 12/2000 | Nishiyama | |

(Continued)

OTHER PUBLICATIONS

Rein, H.-M. et al., "Design Considerations for Very-High-Speed Si-Bipolar IC's Operating up to 50 Gb/s," IEEE Journal of Solid-State Circuits, Aug. 1996, pp. 1076-1090, vol. 31, No. 8.

*Primary Examiner* — Lincoln Donovan
*Assistant Examiner* — Brandon S Cole
(74) *Attorney, Agent, or Firm* — Lisa K. Jorgenson; E. Russell Tarleton; Seed IP Law Group PLLC

(57) ABSTRACT

A prescaling stage includes bistable circuit in turn including respective master and slave portions inserted between a first and a second voltage reference and feedback connected to each other. Each portion is provided with at least one differential stage supplied by the first voltage reference and connected, by a transistor stage, to the second voltage reference, as well as a differential pair of cross-coupled transistors, supplied by output terminals of the differential stage and connected, by the transistor stage, to the second voltage reference. Advantageously, each master and slave portion includes a degeneration capacitance inserted in correspondence with respective terminals of the transistors of the differential pair.

27 Claims, 6 Drawing Sheets

U.S. PATENT DOCUMENTS

| | | | |
|---|---|---|---|
| 6,433,595 B1 * | 8/2002 | Tung et al. | 327/115 |
| 6,958,650 B1 | 10/2005 | Teo | |
| 7,057,469 B2 | 6/2006 | Prentice | |
| 7,202,706 B1 * | 4/2007 | Plasterer et al. | 326/127 |
| 7,288,971 B1 | 10/2007 | Plasterer et al. | |
| 2003/0201815 A1 * | 10/2003 | Tung et al. | 327/359 |

* cited by examiner

PRESCALING STAGE FOR HIGH FREQUENCY APPLICATIONS

BACKGROUND OF THE INVENTION

1. Field of Invention

The present invention relates to a prescaling stage for high frequency applications.

2. Description of the Related Art

As it is well known, modern standards for telecommunications (Hyperland 2, DVB-S, SONET) more and more require circuits able to operate at high frequency. In fact, due to the saturation of the range of the frequencies lower than 5 GHz, allocated for applications being now mature and consolidated such as the radiomobile communication system GSM-DCS (Global System for Mobile Communications—Digital Cellular System, previously indicated as GSM-1800) and the UTMS standard (Universal Mobile Telecommunications System), and for being able to support the information transmission at a higher speed and efficiency, the bands C, Ku and K, i.e., the frequencies bands from 4 to 26.5 Ghz, particularly used by telecommunications satellites are currently of main interest.

Moreover, so that the new applications can provide wide commercial diffusion services, it is fundamental that the circuits are realized by means of low cost technologies, and which operate with low supply voltage and with reduced power dissipation.

In these applications, fixed (i.e., non-programmable) frequency prescalers are widely used, being commonly indicated with the term prescalers, employed for frequency scaling the signal generated by oscillators.

In particular, in frequency synthesizers with radio-frequency based on phase locked loops (PLLs), prescalers are used both inside these loops for implementing a first stage of a programmable frequency divider, and at the output of the loops for providing at the output the in phase and in quadrature signal with respect to the divided VCO oscillator signal.

Prescalers are generally digital circuits whose basic stage essentially comprises a divider by-two prescaler. Hereafter in the description indistinct reference will be made to stages or to prescalers. The highest theoretical operation frequency thereof is represented by the transition frequency, $f_T$, of the technology realizing the circuit.

It is also known that bipolar digital circuits in $E^2CL$ logic (acronym of the English "Emitter-Emitter Coupled Logic") succeed in approaching this theoretical limit by using several common collector stages (emitter followers) cascade connected to each other. A driving stage or driver so realized has in fact a high switching speed without being slowed down by the capacitive load of the subsequent stages.

An example of a static frequency prescaling stage 2:1 in $E^2CL$ logic is schematically shown in FIG. 1 and globally indicated at 10.

The prescaling stage 10 essentially comprises a bistable circuit, in particular a flip-flop 1 of the D type in turn comprising a master portion 2 and a slave portion 3. In particular, the slave portion 3 of the prescaling stage 10 has an output terminal being inverted-connected to an input terminal of the master portion 2.

Each portion 2, 3 comprises a differential stage 4, 5 for the reading operations and a differential pair 6, 7 of the cross-coupled type for the data holding operations. In particular, the differential stage 4 of the master portion 2 is connected to a supply voltage reference Vcc and it has input terminals connected to respective output terminals of the differential stage 5 of the slave portion 3, in turn connected to supply terminals of the differential pair 7 of such slave portion 3.

In a similar way, the differential stage 5 of the slave portion 3 is connected to the supply voltage reference Vcc and it has input terminals connected to respective output terminals of the differential stage 4 of the master portion 2, in turn connected to supply terminals of the differential pair 6 of such master portion 2.

The master 2 and slave 3 portions also comprise suitable resistive loads $R_C$ inserted between the differential stages 4, 5 and the supply voltage reference Vcc.

The master 2 and slave 3 portions also have respective transistor stages 8, 9 connected to the differential stage 4, 5 and to the differential pairs 6, 7 as well as to a second voltage reference, in particular a ground GND, by means of respective current generators G2, G3.

In particular, the transistor stage 8 of the master portion 2 comprises a first Tb1 and a second Tb2 transistors having first conduction terminals connected to the supply voltage reference Vcc by means of the differential stage 4 and the differential pair 6 of the master portion 2, respectively, second common conduction terminals being connected, by means of a first generator G2 of a current IEE to the ground GND, as well as control terminals connected to the differential input terminals IN1 and IN2 of the prescaling stage 10. The control terminals of the first transistor Tb1 of the transistor stage 8 thus corresponds to an input terminal of the master portion 2, while the control terminal of the second transistor Tb2 of the transistor stage 8 corresponds to an output terminal of this master portion 2.

In a similar way, the transistor stage 9 of the slave portion 3 comprises a first Tb3 and a second Tb4 transistors having first conduction terminals being connected to the supply voltage reference Vcc by means of the differential stage 5 and the differential pair 7 of the slave portion 3, respectively, second common conduction terminals being connected, by means of a second generator G3 of a current IEE to the ground GND, as well as control terminals connected to the first input terminal IN1 and to the second input terminal IN2 of the prescaling stage 10, respectively.

The control terminal of the first transistor Tb1 and of the second transistor Tb2 of the transistor stage 8 thus correspond to the input terminals of the slave portion 3. The master 2 and slave 3 stages thus have the same inputs, IN1 and IN2, but they are phase inverted one another. Moreover, as previously described, the output terminal of the slave portion 3 is connected, phase inverted, to the input terminal of the master portion 2.

The prescaling stage 10 also comprises a first T1 and a second T2 output transistors, having first conduction terminals connected to the supply voltage reference Vcc, second conduction terminals connected to a first OUT1 and a second OUT2 output terminals of the prescaling stage 10, respectively, as well as control terminals connected to the output terminal of the differential stage 5 of the slave portion 3 of the flip-flop 1. The output terminals OUT1 and OUT2 of the prescaling stage 10 are also connected to the ground GND, by means of respective current generators Gi1 and Gi2.

The prescaling stage 10 shown in FIG. 1 can be used for low voltage solutions, but it is able to operate at a frequency typically far below the technology transition frequency.

The highest speed of this prescaling stage 10 particularly depends on the cross-coupled differential pairs 6, 7 capacity of correctly carrying out the data holding operation at high frequency.

In particular, considering for simplicity a single cross-coupled differential pair as the one shown in FIG. 2A, it is immediate to verify that the conductance value G(f) thereof has a continuous current (DC) negative value equal to −gm/2 and it grows as the frequency increases.

The quality trend of this conductance is reported by way of example in FIG. 2B.

It is immediate to verify that the conductance becomes positive starting from a frequency given by the following relation:

$$f_{G=0} = \frac{1}{2\pi}\sqrt{\frac{2\pi f_T}{r_B C_\pi}} \quad (1)$$

$C_\pi$ and $r_B$ being the base-emitter capacitance and the base resistance of the transistors comprised in this pair, respectively.

A differential pair realized in this way thus does not ensure a correct data hold for frequencies higher than $f_{G=0}$. Moreover, for devices of reduced size, the resistance value $r_B$ increases, further decreasing the frequency value $f_{G=0}$.

For increasing the prescaling stage speed, it is known from the article of H.-M. Rein and M. Möller, "Design considerations for very-high-speed Si-bipolar IC's operating up to 50 Gb/s" IEEE *J. Solid-State Circuits*, Vol. 31, pp. 1076-1090, August 1996, to realize stages which comprise, at the input of the differential pairs, common collector transistors effective to decouple the stages and through which the cross coupling is carried out realizing cross-coupled differential pairs.

A cross-coupled differential pair with common collector stage of this type is schematically shown in FIG. 3A. Substantially, an emitter follower configuration (EF) is inserted in the feedback path of the transistors of the differential pair.

The common connection of the collectors increases the frequency value at which the conductance becomes positive ($f_{G=0}$), as shown in FIG. 3B by means of the broken line.

In this way it is possible to realize prescalers which operate at high operation frequencies (possibly also close to the theoretical limit $f_T$) by inserting two or more cascade connected common collector stages. Prescalers of this type however cannot be considered of the low-voltage type.

A fixed frequency prescaling stage with common collector stages realized according to the prior art is shown in FIG. 4 and globally indicated with 40. The prescaler stage 40 comprises, with respect to the prescaling stage 10, a first 20 and a second 30 emitter follower stage connected to the master 2 and slave 3 portions, respectively.

In substance, the known solutions have different limits, among which:

1. It is necessary to boost the supply voltage to suitably bias a common collector stage cascade.

2. In common collector stages transistors with wide emitter area have to be used, which requires a high current consumption.

In fact, at high frequencies the current gain of a transistor decreases and thus a single common collector would not be enough to carry out the load decoupling in an efficient way.

Moreover, the output impedance of the common collector stages has a negative real part and it has an inductive behavior which could resonate with the load, which is typically capacitive and thus, potentially, trigger oscillations. Since the negative real part and the inductive behavior of the impedance is linked to the base resistance, $r_B$, of the transistors, the oscillations trigger more easily in the devices of minimum size.

Finally, if in a traditional fixed frequency prescaler it is necessary to boost the supply voltage to operate at frequencies being close to the limit value $f_T$, this implies the need of having devices with wide margin of the breakdown voltage so that they can safely support the high drops of collector-emitter voltage (VCE). Unfortunately, most advanced fast bipolar known technologies generally suffer from a very low breakdown voltage.

These high speed fixed frequency prescalers are thus the critical blocks in the design of circuits for multi-GHz applications, such as for example the new optical fiber networks.

BRIEF SUMMARY OF THE INVENTION

One embodiment of the present invention provides a fixed frequency prescaling stage able to operate at high speed although maintaining low voltage values overcoming in this way the limits which still affect the prescalers realized according to the prior art.

More specifically, the prescaling stage includes a bistable circuit in turn including respective master and slave portions inserted between a first and a second voltage reference and feedback connected to each other, each provided with at least one differential stage supplied by the first voltage reference and connected, by means of a transistor stage, to the second voltage reference, as well as a differential pair of cross-coupled transistors, supplied by the output terminals of the differential stage and connected, by means of the transistor stage, to the second voltage reference.

The prescaling stage overcomes the need of using common collector stages by employing, in a fixed frequency prescaling stage configuration of the E²CL type, a degeneration capacitor for controlling the frequency value at which the conductance of the cross-coupled differential pair providing the data holding function becomes positive.

Another embodiment of the invention is directed to a control method of a conductance value of a differential pair of cross-coupled transistors which realize a data holding stage in the master and slave portions of a prescaling stage.

The invention particularly, but not exclusively, relates to a fixed frequency prescaling stage having high speed and low voltage for high frequency applications and in particular for telecommunications and the following description is made with reference to this field of application for convenience of illustration only.

The characteristics and advantages of the prescaling stage according to the invention will be apparent from the following description of an embodiment thereof given by way of indicative and non-limiting example with reference to the annexed drawings.

DETAILED DESCRIPTION OF THE INVENTION

Figure 5:
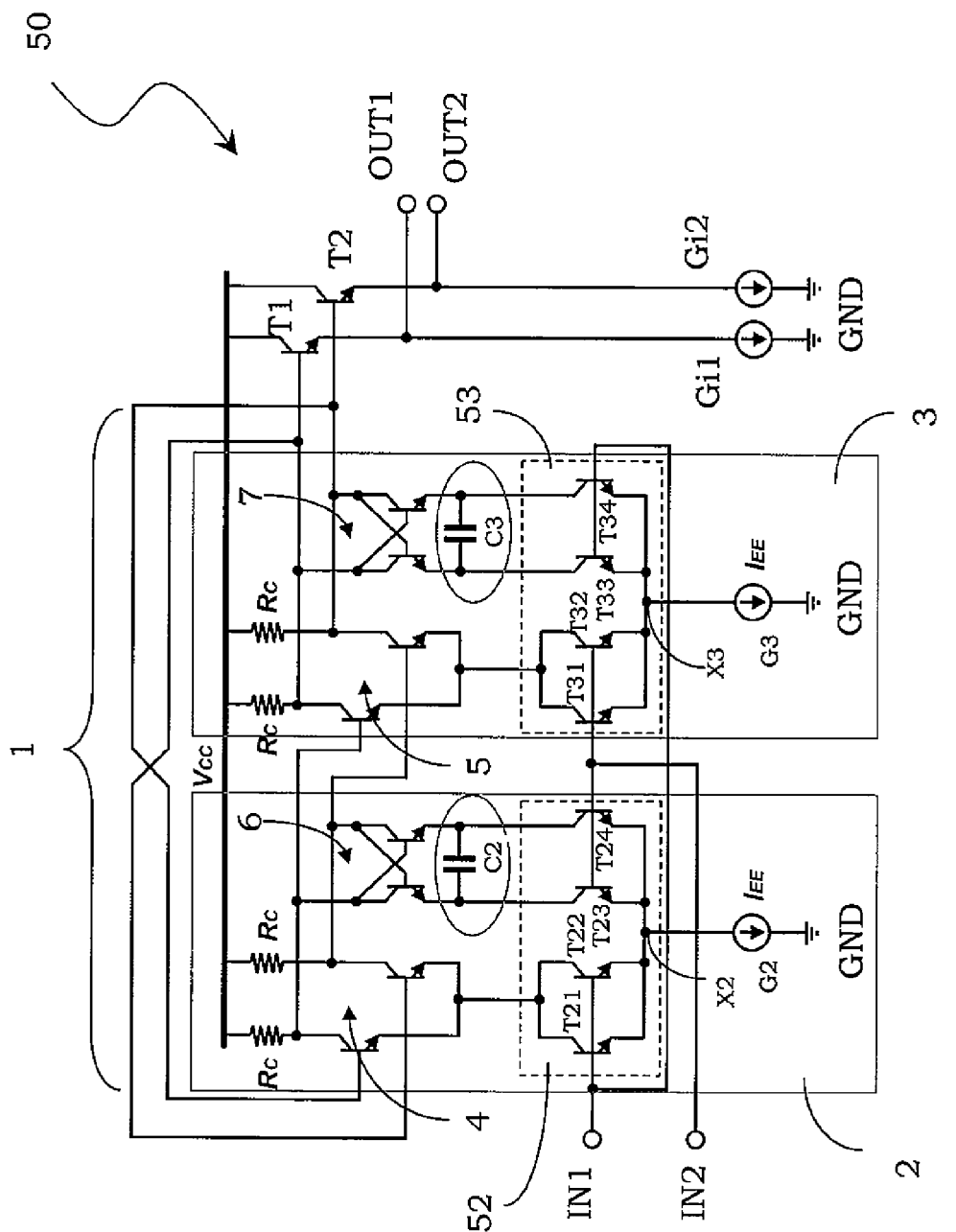
FIG. 5 schematically shows a prescaling stage realized in E²CL logic according to the invention.

With reference to these drawings, and in particular to FIG. 5, a prescaling stage realized according to one embodiment of the present invention is shown, globally and schematically indicated at 50.

For simplicity of illustration, the same numeral references will be allotted to structurally and functionally elements being similar to that described with reference to the stages described with reference to the prior art.

The prescaling stage 50 thus comprises a bistable circuit, in particular a flip-flop 1 of the D type in turn comprising a master portion 2 and a slave portion 3, in turn including respective differential stages 4, 5 for the reading operations and differential pairs 6, 7 of the cross-coupled type for the data holding operations.

As it has been seen in relation with the prior art, the differential stage 4 of the master portion 2 is connected, by means of resistive loads $R_C$, to a supply voltage reference Vcc and it has input terminals 11A, 11B connected to respective output terminals 12A, 12B of the differential stage 5 of the slave portion 3, in turn connected to supply terminals of the differential pair 7 of this slave portion 3.

In a similar way, the differential stage 5 of the slave portion 3 is connected, by means of resistive loads $R_C$, to the supply voltage reference Vcc and it has input terminals 13A, 13B connected to respective output terminals 14A, 14B of the differential stage 4 of the master portion 2, in turn connected to supply terminals of the differential pair 6 of this master portion 2.

The prescaling stage 50 starts from the consideration that the use of common collector configuration, necessary to obtain high operative frequencies, represents the main limit of traditional prescaling stages.

Therefore, the master and slave portions 2 and 3 of this prescaling stage 50 have a capacitive degeneration realized by means of respective degeneration capacitors C2 and C3 inserted between the emitter terminals of the differential pairs 6 and 7.

In this way the common collector decoupling stages are not employed, which limit the performances of the prescaling stage.

Moreover, the master and slave portions 2 and 3 have respective transistor stages 52 and 53 connected to the differential stages 4, 5 and to the differential pairs 6, 7 as well as to a second voltage reference, in particular a ground GND, by means of respective current generators G2, G3.

In particular, the transistor stage 52 of the master portion 2 comprises a first transistor T21 and a second transistor T22 inserted, in parallel with each other, between the differential stage 4 and a first internal circuit node X2 and having respective control terminals connected to each other and to the first input terminal IN1 of the prescaling stage 50.

Moreover, this transistor stage 52 comprises a third transistor T23 inserted between a first end of the first degeneration capacitance C2 and the first internal circuit node X2 and having a control terminal connected to the second input terminal IN2.

Finally, the transistor stage 52 comprises a fourth transistor T24 inserted between a second end of the first degeneration capacitance C2 and the first internal circuit node X2 and having a control terminal connected to the second input terminal IN2.

In a similar way, the transistor stage 53 of the slave portion 3 comprises a first transistor T31 and a second transistor T32 inserted, in parallel with each other, between the differential stage 5 and a second internal circuit node X3 and having respective control terminals connected, in correspondence with the second input terminal IN2.

Moreover, this transistor stage 53 comprises a third transistor T33 inserted between a first end of the second degeneration capacitance C3 and the second internal circuit node X3 and having a control terminal connected to the first input terminal IN1 of the prescaling stage 50.

Finally, the transistor stage 53 comprises a fourth transistor T34 inserted between a second end of the second degeneration capacitance C3 and the second internal circuit node X3 and having a control terminal connected to the control terminal of the third transistor T33 and to the first input terminal IN1 of the prescaling stage 50.

The first X2 and the second X3 internal circuit nodes are connected to the ground by means of the first G2 and the second G3 generators, in the shown embodiment of a same current IEE.

Figure 1:
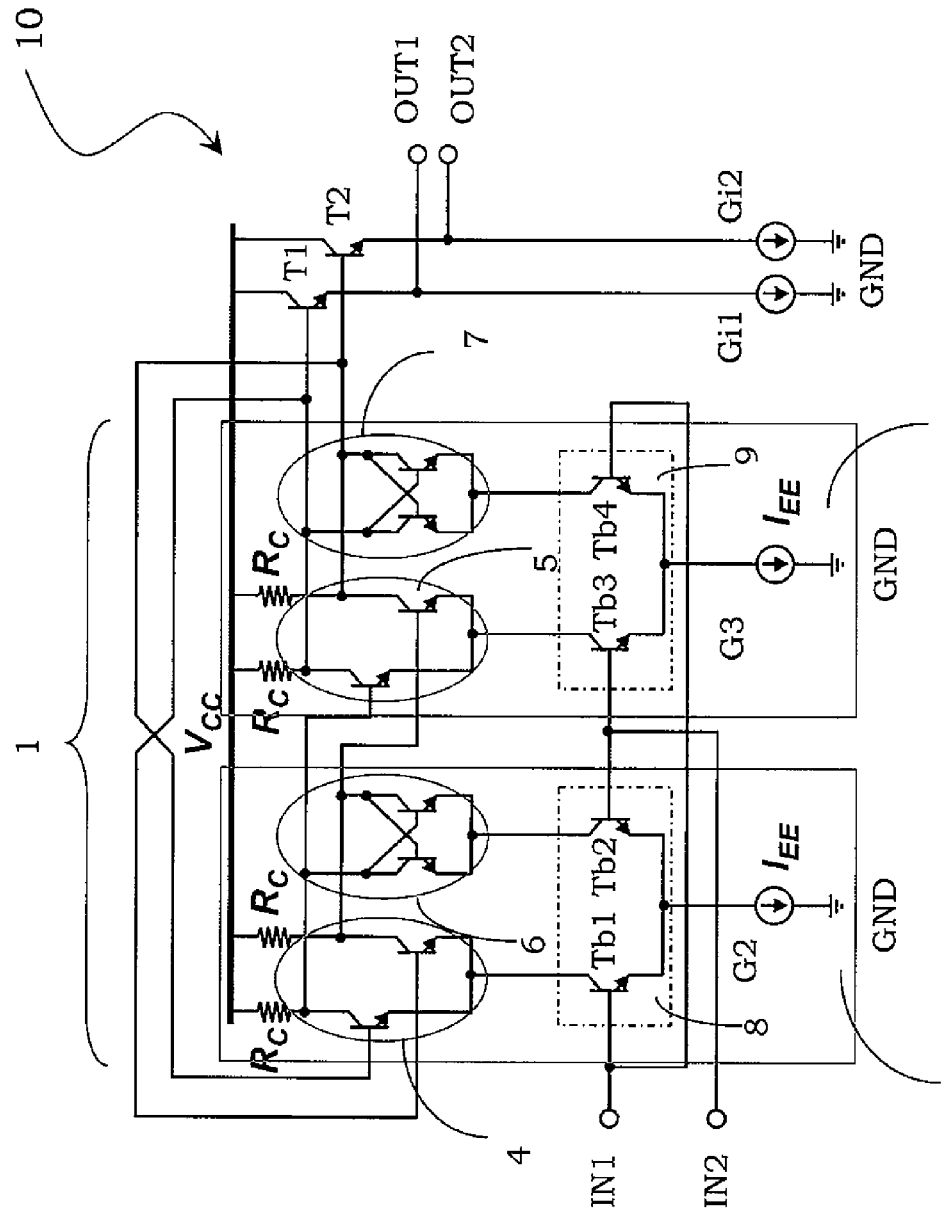
FIG. 1 schematically shows a prescaling stage realized in E²CL logic according to the prior art.

Advantageously, the transistors T21-T22 and T23-T24 substitute and have the same functions as the transistors Tb1 and Tb2 of the prescaling stage 10 realized according to the prior art and shown in FIG. 1. This configuration also allows to correctly use the degeneration capacitor C2 in the master portion 2 of the prescaler 50. Similarly, the transistors T31-T32 and T33-T34 substitute the transistors Tb3 and Tb4 of the prescaling stage 10 realized according to the prior art and they allow to correctly use the capacitor C3 in the slave portion 3 of the prescaler 50.

Finally, as it has been seen in relation with the prior art, the prescaling stage 50 comprises a first output transistor T1 and a second output transistor T2, having first conduction terminals connected to the supply voltage reference Vcc, second conduction terminals connected to a first OUT1 and to a second OUT2 output terminals of the prescaling stage 50, respectively, as well as control terminals connected to the output terminals of the differential stage 5 of the slave portion 3 of the flip-flop 1. The output terminals OUT1 and OUT2 of the prescaling stage 50 are also connected to the ground GND, by means of respective current generators Gi1 and Gi2.

In the preferred embodiment shown in FIG. 5, the prescaling stage 50 has a symmetrical structure for the master 2 and slave 3 portions and it comprises degeneration capacitances C2 and C3 of equal value $C_E$.

It should be noted that the master and slave portions of the prescaling stage 50 according to the invention have a symmetrical configuration which is typical of any flip-flop. In particular, using degeneration capacitors C2 and C3 of equal value allows to preserve this symmetry, simplifying the realization of the prescaling stage 50 as a whole.

Moreover, although the shown embodiment is realized with bipolar technology, it is also possible to realize the prescaling stage 50 according to the invention with MOS technology or with any other available technology.

One embodiment of the present invention is directed to a control method of a conductance value of a cross-coupled differential pair which performs the data holding operation in a prescaling stage. Advantageously, this method provides the use of a capacitive degeneration for the regulation of the conductance thanks to a degeneration capacitance inserted at the ends of the cross-coupled differential pair.

In particular, it is possible to regulate the frequency value at which the conductance becomes positive, referred to with $f_{G=0}$, simply by varying the value of this degeneration capacitance.

In substance, the prescaling stage 50 implementing the control method of the conductance has a basic structure realized by means of a master-slave flip-flop of the D type, and it uses a capacitive degeneration in the cross-coupled differential pair of the master and slave portions.

It is immediate to verify that the proposed prescaling stage 50 has a conductance of the cross-coupled differential pair which becomes positive in correspondence with the frequency given by the following relation:

$$f_{G=0} = \frac{1}{2\pi}\sqrt{\frac{2\pi f_T\left(\frac{1}{C_E}+\frac{1}{C_\pi}\right)}{r_B}} \quad (2)$$

being $f_T$ the transition frequency of the technology;

$C\pi$ the base-emitter capacitance of the transistors comprised in the differential pair;

$r_B$ the base resistance of the transistors comprised in the differential pair; and $C_E$ the value of the degeneration capacitance.

In this way, it is possible to control the frequency value at which the conductance becomes positive, referred to with $f_{G=O}$, simply by varying the value $C_E$ of this degeneration capacitance. It is thus possible to extend the highest operative frequency of the prescaling stage 50.

Figure 6A:
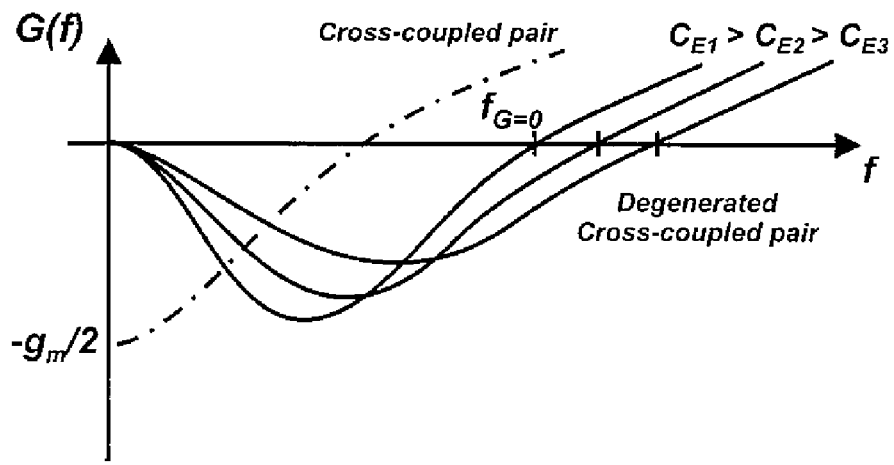
FIGS. 6A and 6B show results of the simulations performed on the prescaling stage according to the invention and on those realized according to the prior art.

The conductance G(f) trend of a cross-coupled differential pair of the prescaling stage 50 realized according to the invention in function of the frequency is schematically shown in FIG. 6A.

Figure 2B:
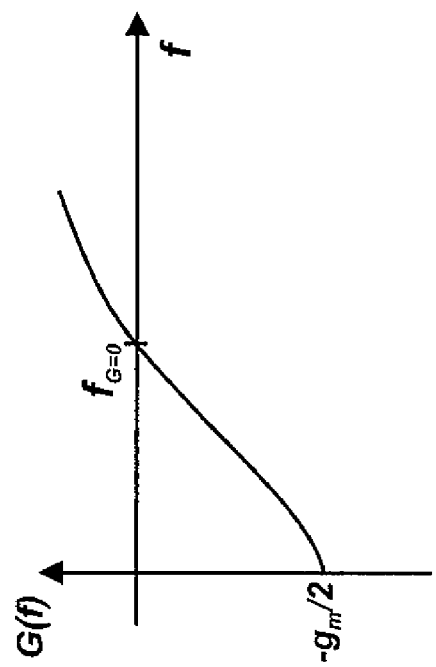
FIG. 2B shows the conductance trend of the detail of FIG. 2A.
Figure 2A:
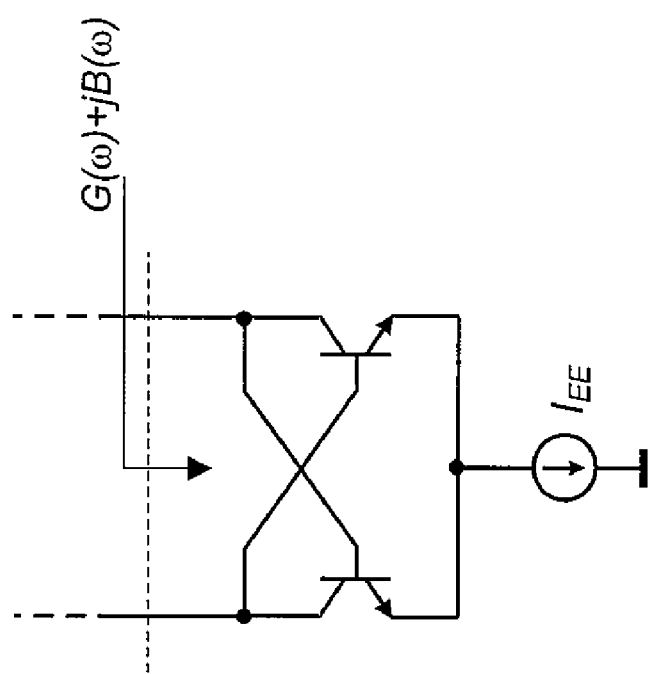
FIG. 2A schematically shows a first known embodiment of a detail of the stage of FIG. 1.
Figures 3A, 3B:
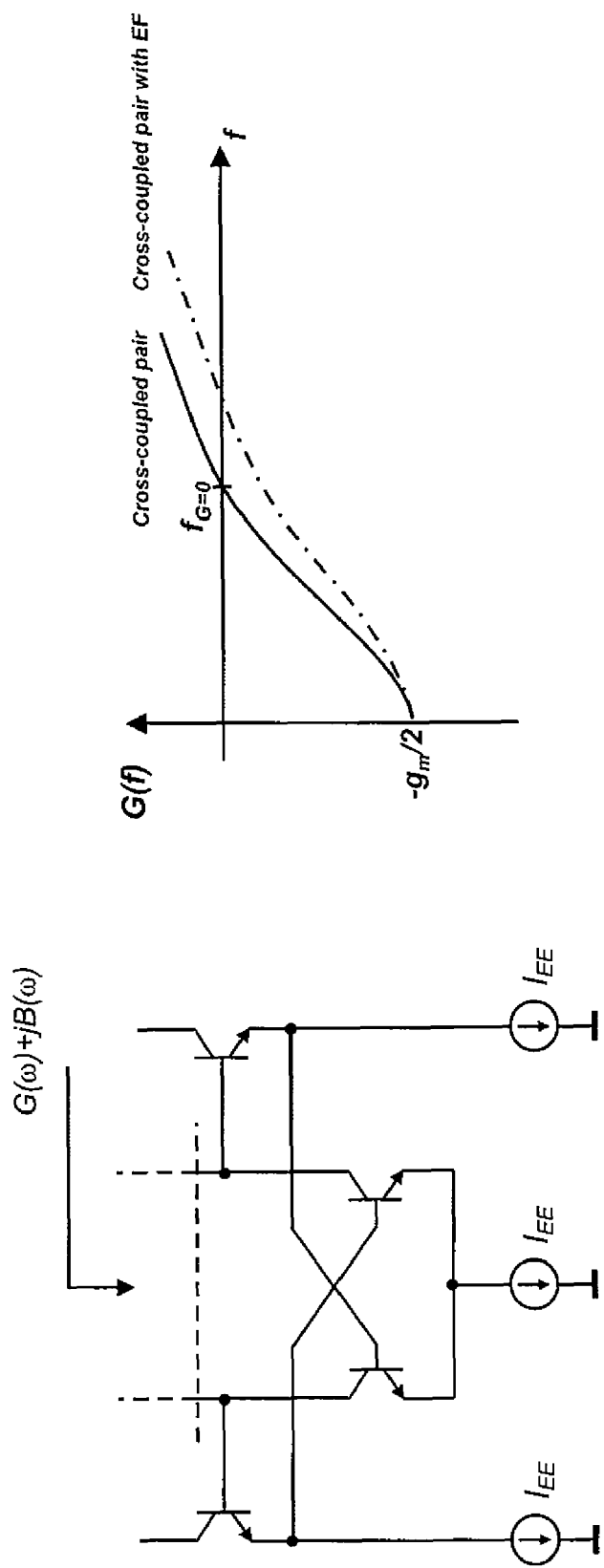
FIG. 3A schematically shows a third known embodiment of a detail of the stage of FIG. 1.
FIG. 3B shows the conductance trend of the detail of FIG. 3A.
Figure 4:
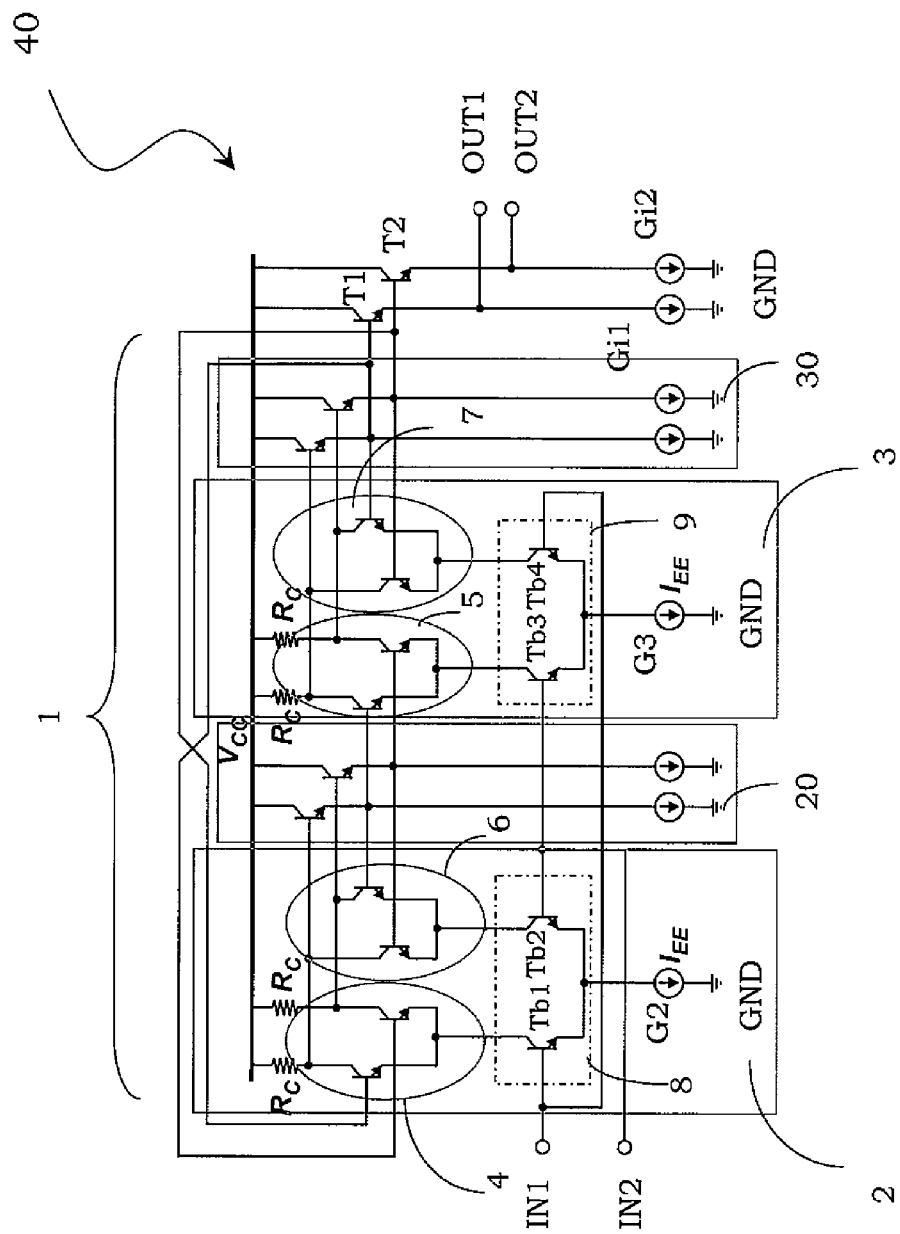
FIG. 4 schematically shows a further embodiment of the by-two prescaling stage realized in E²CL logic according to the prior art.

In particular, in this graph the conductance of the cross-coupled differential pair with capacitive degeneration of the prescaling stage 50 according to the invention is compared with that of the differential pairs realized according to the prior art, in particular, according to the embodiment shown in FIG. 2A, indicated with a broken line. It is immediate to verify that, at a low frequency, the conductance G(f) of the prescaling stage 50 is close to zero, whereas at a high frequency, where the prescaling stage 50 is effectively employed, the conductance module is higher than the traditional case and it cancels out in correspondence with higher frequencies the more little is the value $C_E$ of the degeneration capacitance.

Experimental tests have been carried out by the Applicant to compare the performances of the circuit solutions described with reference to the prior art and the prescaling stage 50.

In particular, simulations have been carried out by employing an improved silicon bipolar technology for radio-frequency applications, which exhibits a transition frequency $f_T$ of 46 GHz. The following values have also been used:

base resistance $r_B$=600Ω;

base-emitter capacitance $C\pi$=37 fF.

In particular, the hereafter reported Table I summarizes the parameters used in the simulations and the comparison of the performances between the prescaling stage 10 of FIG. 1 (PA1) and the prescaling stage 50 (INV). Both simulations have been realized for low voltage values (low-voltage solutions), even if the prescaling stage 50 can operate at a frequency of 24% higher showing the same power dissipation.

TABLE I

| Parameter | PA1 | INV |
| --- | --- | --- |
| $V_{CC}$ | 3 V | 3 V |
| $I_{EE}$ | 300 μA | 300 μA |
| $R_C$ | 833 Ω | 833 Ω |
| $C_E$ | — | 50 fF |
| total dissipated power | 2.7 mW | 2.7 mW |
| $f_{max}$ | 6.7 GHz | 8.3 GHz |

Figure 6B:
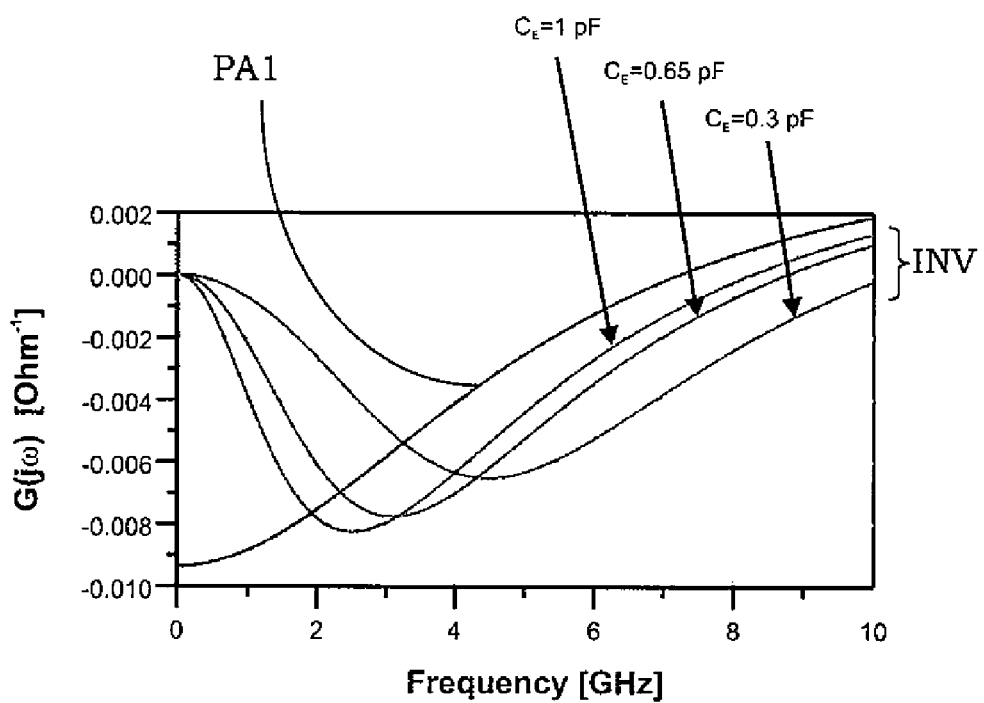

FIG. 6B shows the conductance trends of the cross-coupled differential pairs in the prescaling stages according to the prior art (PA1) and according to the prescaling stage 50 (INV, for different values of the degeneration capacitance $C_E$).

Table II instead reports the comparison of the performances between the prescaling stage 40 of FIG. 2 (PA2) and the prescaling stage 50 (INV).

TABLE II

| Parameters | PA2 | INV |
| --- | --- | --- |
| $V_{CC}$ | 3.5 V | 3 V |
| $I_{EE}$ | 300 μA | 300 μA |
| $R_C$ | 833 Ω | 833 Ω |
| $C_E$ | — | 50 fF |
| total dissipated power | 5.25 mW | 2.7 mW |
| $f_{max}$ | 8.3 GHz | 8.3 GHz |

It can be thus verified that, with equal highest operative frequency, the prescaling stage 50 according to the invention is able to operate at a low supply voltage (for example equal to 3V) and with a power absorption lower than 48.5%.

The carried out simulations allow to conclude that the prescaling stage 50 is fast, able to operate close to the $f_T$, without employing common collector stages. Therefore, the advantages of the proposed prescaling stage 50 are:

1. High operative frequency, close to the theoretical limit $f_T$.
2. Low supply voltage (low-voltage).
3. Reduced consumption of power (low-power).

In particular, the prescaling stage 50 is able to operate at higher frequencies than 24% with respect to a traditional low-voltage prescaling stage and that the power dissipation is reduced of 48.5%, for a same operative frequency, with respect to a prescaling stage with common collector stages.

In conclusion, the prescaling stage 50 can be thus efficiently used in the circuits for modern standards for telecommunications, overcoming the drawbacks still affecting the prescalers realized in the field.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A prescaling stage, comprising:
a supply voltage terminal and a voltage reference terminal;
a bistable latch circuit having respective master and slave portions coupled between the supply voltage terminal and the voltage reference terminal and feedback coupled to each other, each of the master and slave portions including:
a differential stage coupled to the supply voltage terminal and including output terminals;
a differential pair of cross-coupled transistors coupled to the output terminals of the differential stage;
a transistor stage coupling the differential pair of cross-coupled transistors to the voltage reference terminal, the transistor stage having first and second transistors in parallel with each other and coupled to respective transistors in the pair of cross-coupled transistors and between the differential pair and an internal circuit node and having respective control terminals connected to each other; and
a degeneration capacitance coupled to respective emitter or source terminals of the transistors of the differential pair and structured to increase a maximum working frequency of the bistable latch circuit.

2. The prescaling stage according to claim 1, wherein the transistor stage of each of the master and slave portions further comprises a third transistor inserted between a first end of the degeneration capacitance and the internal circuit node, as well as a fourth transistor inserted between a second end of the degeneration capacitance and the internal circuit node, the third and fourth transistors having common control terminals.

3. The prescaling stage according to claim 2, wherein the common control terminals of the first and second transistors in the transistor stage of the master portion and the common control terminals in the transistor stage of the third and fourth transistor of the slave portion are connected to each other and to an input terminal of the prescaling stage.

4. The prescaling stage according to claim 2, wherein the common control terminals of the third and fourth transistor in the transistor stage of the master portion and the common control terminals of the first and second transistors in the transistor stage of the slave portion are connected to each other in correspondence with an input terminal of the prescaling stage.

5. The prescaling stage according to claim 2, wherein the internal circuit node is coupled to the voltage reference terminal by a current generator.

6. The prescaling stage according to claim 1, wherein the degeneration capacitance of the master portion and the degeneration capacitance of the slave portion have a same capacitive value.

7. A circuit, comprising:
a supply voltage terminal and a voltage reference terminal;
a bistable latch circuit having respective master and slave portions coupled between the supply voltage terminal and the voltage reference terminal and feedback coupled to each other, each of the master and slave portions including:
a differential stage coupled to the supply voltage terminal and including output terminals;
a differential pair of cross-coupled bipolar transistors coupled to the output terminals of the differential stage;
a respective transistor stage coupling the differential stage and the differential pair of cross-coupled transistors to the voltage reference terminal, the transistor stage having first and second parallel coupled transistors with common control terminals, the first and second parallel coupled transistors coupled to the respective bipolar transistors in the differential pair of cross-coupled transistors; and
a degeneration capacitance coupled to respective emitter terminals of the bipolar transistors of the differential pair.

8. The circuit of claim 7, wherein the bistable circuit includes first and second output terminals, the circuit further comprising:
first and second output transistors coupled between the supply voltage terminal and the voltage reference terminal and having respective control terminals coupled to the first and second output terminal of the bistable circuit.

9. A circuit, comprising:
a prescaling stage that includes:
a supply voltage terminal and a voltage reference terminal;
a latch circuit having a differential stage coupled to the supply voltage terminal by a resistive load and having output terminals;
a differential pair of cross-coupled transistors by coupled to the output terminals of the differential stage;
a transistor stage coupling the differential stage and the differential pair of cross-coupled transistors to the voltage reference terminal, the transistor stage having first and second transistors in parallel with each other and coupled to the respective transistors in the pair of cross-coupled transistors and to an internal circuit node and having respective control terminals coupled to each other; and
a degeneration capacitance coupled between respective emitter or source terminals of the transistors of the differential pair.

10. The circuit of claim 9, wherein the transistor stage further comprises a third transistor coupled in parallel with a fourth transistor, the third and fourth transistors coupled between the differential stage and the internal circuit node, the third and fourth transistors having common control terminals.

11. The circuit of claim 10, wherein the common control terminals of the first and second transistors are coupled to a first input terminal of the prescaling stage and the common control terminals of the third and fourth transistors are coupled to a second input terminal of the prescaling stage.

12. The circuit of claim 10, further comprising a current generator connecting the internal circuit node to the voltage reference terminal.

13. A circuit, comprising:
a fixed frequency prescaling stage having a high speed and low voltage for high frequency application, the pre-scaling stage including:
a bistable circuit in turn including respective master and slave portions inserted between a supply voltage and a voltage reference and feedback connected to each other, each of the master and slave portions including:
a supply voltage terminal and a voltage reference terminal;
a differential stage having output terminals coupled to the supply voltage terminal;
a differential pair of cross-coupled transistors, coupled to the output terminals of the differential stage;
a transistor stage coupling the differential stage and the differential pair of cross-coupled transistors to the voltage reference terminal, the transistor stage having first and second parallel coupled transistors with common control terminals, the first and second parallel coupled transistors coupled to respective transistors in the pair of cross-coupled transistors;
a degeneration capacitance inserted in correspondence with respective emitter or source terminals of the transistors of the differential pair.

14. The prescaling stage according to claim 13, wherein the transistor stage of each of the master and slave portions further comprises a third transistor coupled in parallel with a fourth transistor, the third and fourth transistors coupled between the differential stage and the voltage reference terminal, the third and fourth transistor having common control terminals.

15. The prescaling stage according to claim 13, wherein the degeneration capacitance of the master portion and the degeneration capacitance of the slave portion have a same capacitive value.

16. A circuit, comprising:
a bistable latch circuit having respective master and slave portions coupled between a supply voltage terminal and a voltage reference terminal and feedback coupled to each other, each of the master and slave portions including:
a differential stage coupled to the supply voltage terminal;
a resistive load coupled between the differential stage and the supply voltage terminal;
a differential pair of cross-coupled transistors coupled to the output terminals of the differential stage;
a degeneration capacitance coupled to respective emitter or source terminals of the transistors of the differential pair and structured to increase a maximum working frequency of the bistable latch circuit; and
a transistor stage coupling the differential stage and the differential pair of cross-coupled transistors to the voltage reference terminal, the transistor stage having first and second transistors coupled in parallel with each other between the differential stage and an internal circuit node and having respective control terminals coupled to each other, the transistor stage further including a third transistor coupled between a first end of the degeneration capacitance and the internal circuit node, as well as a fourth transistor coupled between a second end of the degeneration capacitance and the internal circuit node, the third and fourth transistors having common control terminals.

17. The circuit of claim 16, wherein the common control terminals of the first and second transistors in the transistor stage of the master portion and the common control terminals of the third and fourth transistor in the transistor stage of the slave portion are coupled to each other and to an input terminal of the circuit.

18. The circuit of claim 16, wherein the common control terminals of the third and fourth transistor in the transistor stage of the master portion and the common control terminals of the first and second transistors in the transistor stage of the slave portion are coupled to each other in correspondence with an input terminal of the circuit.

19. The circuit of claim 16, wherein the internal circuit node is coupled to the supply voltage terminal by a current generator.

20. The circuit of claim 16, wherein the degeneration capacitance of the master portion and the degeneration capacitance of the slave portion have a same capacitive value.

21. A prescaling stage, comprising:
a latch circuit that includes a differential stage coupled to a first voltage terminal by a resistive load and having output terminals;
a differential pair of cross-coupled transistors coupled to the output terminals of the differential stage;
a degeneration capacitance coupled between respective emitter or source terminals of the transistors of the differential pair; and
a transistor stage coupling the differential stage and the differential pair of cross-coupled transistors to a second voltage terminal, the transistor stage including first and second transistors coupled in parallel with each other and coupled between the differential stage and an internal circuit node and having respective control terminals coupled to each other, and a third transistor coupled between a first end of the degeneration capacitance and the internal circuit node, as well as a fourth transistor coupled between a second end of the degeneration capacitance and the internal circuit node, the third and fourth transistors having common control terminals.

22. The prescaling stage of claim 21, wherein the common control terminals of the first and second transistors are coupled to a first input terminal of the prescaling stage and the common control terminals of the third and fourth transistors are coupled to a second input terminal of the prescaling stage.

23. The prescaling stage of claim 21, further comprising a current generator coupling the internal circuit node to the second voltage terminal.

24. A system, comprising:
a bistable circuit that includes respective master and slave portions coupled between a supply voltage terminal and a voltage reference terminal and feedback coupled to each other, each of the master and slave portions including:
a differential stage coupled by a resistive load to the supply voltage terminal, the differential stage having output terminals;
a differential pair of cross-coupled transistors coupled to the output terminals of the differential stage;
a degeneration capacitance coupled in correspondence with respective emitter or source terminals of the transistors of the differential pair; and
a transistor stage coupling the differential stage and the differential pair of cross-coupled transistors to the voltage reference terminal, the transistor stage of each of the master and slave portions having first and second transistors coupled, in parallel with each other, between the differential stage and an internal circuit node and having respective control terminals coupled to each other, a third transistor coupled between a first end of the degeneration capacitance and the internal circuit node, as well as a fourth transistor coupled between a second end of the degeneration capacitance and the internal circuit node, the third and fourth transistors having common control terminals.

25. The system of claim 24, wherein the degeneration capacitance of the master portion and the degeneration capacitance of the slave portion have a same capacitive value.

26. The system of claim 24, wherein the common control terminals of the first and second transistors in the transistor stage of the master portion and the common control terminals of the third and fourth transistor in the transistor stage of the slave portion are coupled to each other and to an input terminal of the circuit.

27. The system of claim 24, wherein the common control terminals of the third and fourth transistor in the transistor stage of the master portion and the common control terminals of the first and second transistors in the transistor stage of the slave portion are coupled to each other in correspondence with an input terminal of the circuit.

* * * * *